United States Patent
Yeh et al.

(10) Patent No.: US 7,924,405 B2
(45) Date of Patent: Apr. 12, 2011

(54) COMPENSATION OF RETICLE FLATNESS ON FOCUS DEVIATION IN OPTICAL LITHOGRAPHY

(75) Inventors: Lee-Chih Yeh, Hsinchu (TW); Hsin-Chang Lee, Hsin-Chu Xian (TW); Chia-Jen Chen, Hsinchu County (TW); Tzu-Yi Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 367 days.

(21) Appl. No.: 11/829,701

(22) Filed: Jul. 27, 2007

(65) Prior Publication Data

US 2009/0027643 A1 Jan. 29, 2009

(51) Int. Cl.
G03B 27/52 (2006.01)
G03B 27/32 (2006.01)

(52) U.S. Cl. .......................... 355/55; 355/77
(58) Field of Classification Search ................ 355/53, 355/72, 75, 77; 430/311
See application file for complete search history.

(56) References Cited

U.S. PATENT DOCUMENTS

| | | | | |
|---|---|---|---|---|
| 5,640,227 A * | 6/1997 | Kato et al. | ......... | 355/53 |
| 5,862,417 A * | 1/1999 | Ogasawara | ......... | 396/95 |
| 6,262,792 B1 * | 7/2001 | Higashiki | ......... | 355/52 |
| 6,975,384 B2 * | 12/2005 | Ina | ......... | 355/55 |
| 7,068,349 B2 | 6/2006 | Minnaert-Janssen et al. | | |
| 7,315,350 B2 * | 1/2008 | Kurosawa | ......... | 355/55 |
| 2002/0167651 A1 | 11/2002 | Boonman et al. | | |
| 2002/0192598 A1 * | 12/2002 | Hirayanagi | ......... | 430/311 |
| 2003/0016338 A1 * | 1/2003 | Yasuda et al. | ......... | 355/55 |
| 2003/0090640 A1 * | 5/2003 | Fujisawa et al. | ......... | 355/53 |
| 2004/0227916 A1 * | 11/2004 | Kono et al. | ......... | 355/53 |
| 2006/0203232 A1 * | 9/2006 | Okita | ......... | 356/237.2 |
| 2006/0268255 A1 * | 11/2006 | Shiode et al. | ......... | 355/75 |

OTHER PUBLICATIONS

Gregory McIntyre, Andrew Neureuther, PSM Polarimetry: Monitoring Polarization at 193nm High-NA and Immersion with Phase Shifting Masks, 2004, Proceedings of SPIE vol. 5754.*
S.K. Ramesh, Kuo Chu Wong, Design and fabrication of a Fiber Bragg Grating temperature sensor, 1999, SPIE vol. 3620.*
Nikolay N. Shchelkanov, Application of a generalized formula of linear regression for construction of one-parameter models of aerosol extinction, 2004, Proceedings of SPIE vol. 5743.*
"Flatness Metrology System for LCD's" Nikkei Electronics Asia—Jul. 2006, 1 page, http://techon.nikkeibp.co.jp/article/HONSHI/20060726/119548/.

* cited by examiner

*Primary Examiner* — Edward J Glick
*Assistant Examiner* — Deoram Persaud
(74) *Attorney, Agent, or Firm* — Haynes and Boone, LLP

(57) ABSTRACT

A method for lithography patterning includes providing a mask for photolithography patterning; measuring a mask flatness of the mask; calculating focal deviation of imaging the mask to a substrate in a lithography apparatus; adjusting the lithography apparatus to have a compensated focal plane of the mask based on the focal deviation; and exposing the semiconductor substrate utilizing the mask and the lithography apparatus with adjusted focal plane.

17 Claims, 3 Drawing Sheets

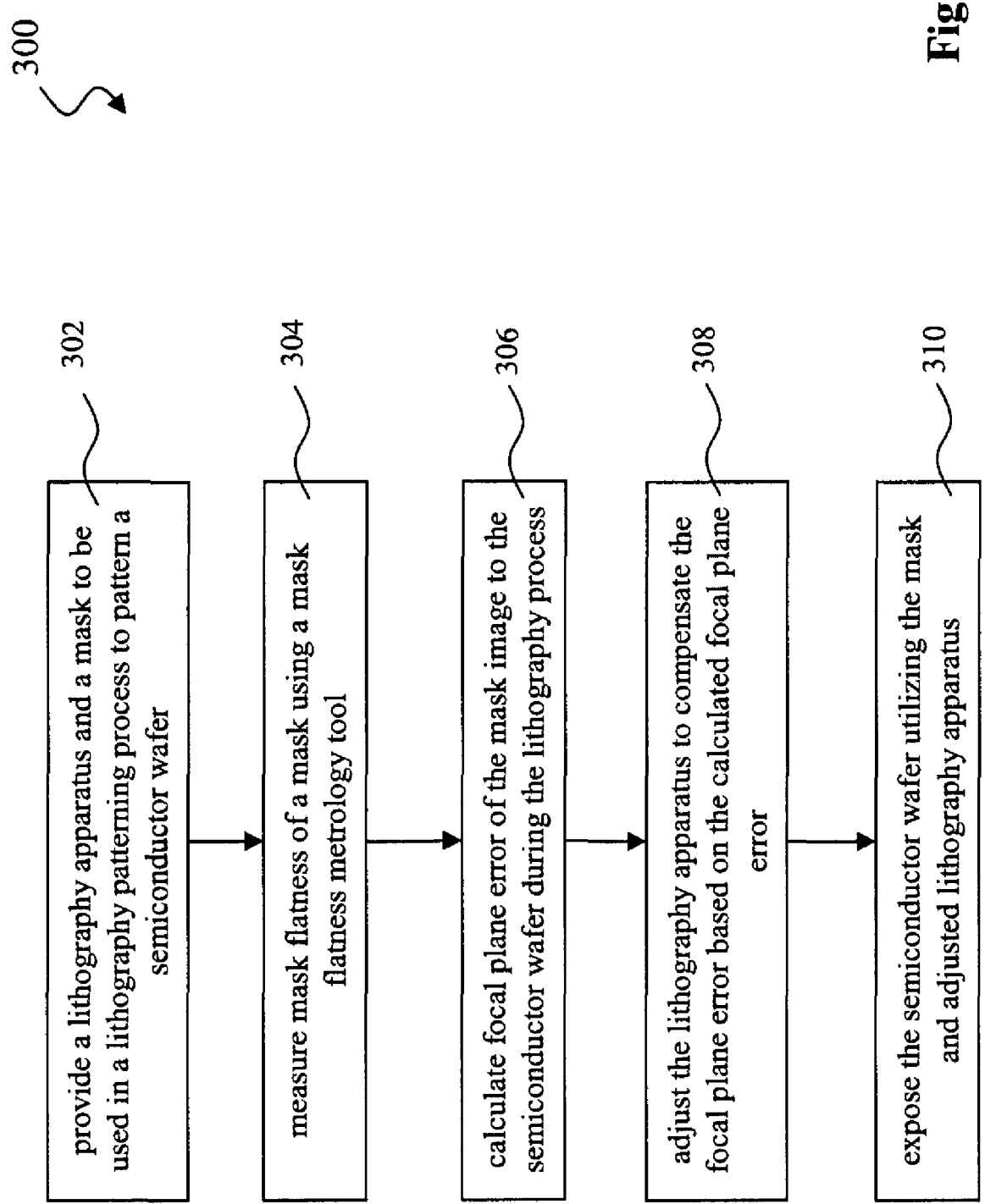

COMPENSATION OF RETICLE FLATNESS ON FOCUS DEVIATION IN OPTICAL LITHOGRAPHY

BACKGROUND

Semiconductor integrated circuit (IC) technology is continually progressing to circuit layouts having smaller feature sizes as well as increased density. As a result of this continuous progression, a photolithography system is more sensitive to flatness of a mask having circuit patterns to be transferred to a semiconductor wafer. It is also necessary to evaluate focal plane error and tune a lens module of the photolithography system for enhanced resolution and reduced deformation. Current practice involves measuring reticle shape correction (RSC) marks on a mask. The RSC marks are disposed around (but not in) the main pattern of the mask. The flatness data of the mask within the main pattern region cannot be directly measured. Instead, they are simulated based on the flatness data on these peripheral regions surrounding the main pattern region. This results in inaccurate overall measurements and adversely limits any resulting resolution improvement.

It is desired, therefore, to provide a method and apparatus for measuring mask flatness and compensating focal plane error more accurately and effectively.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIG. 3 is a flowchart of one embodiment of a method for measuring mask flatness and compensating focal deviation constructed according to aspects of the present disclosure.

DETAILED DESCRIPTION

Figure 1:
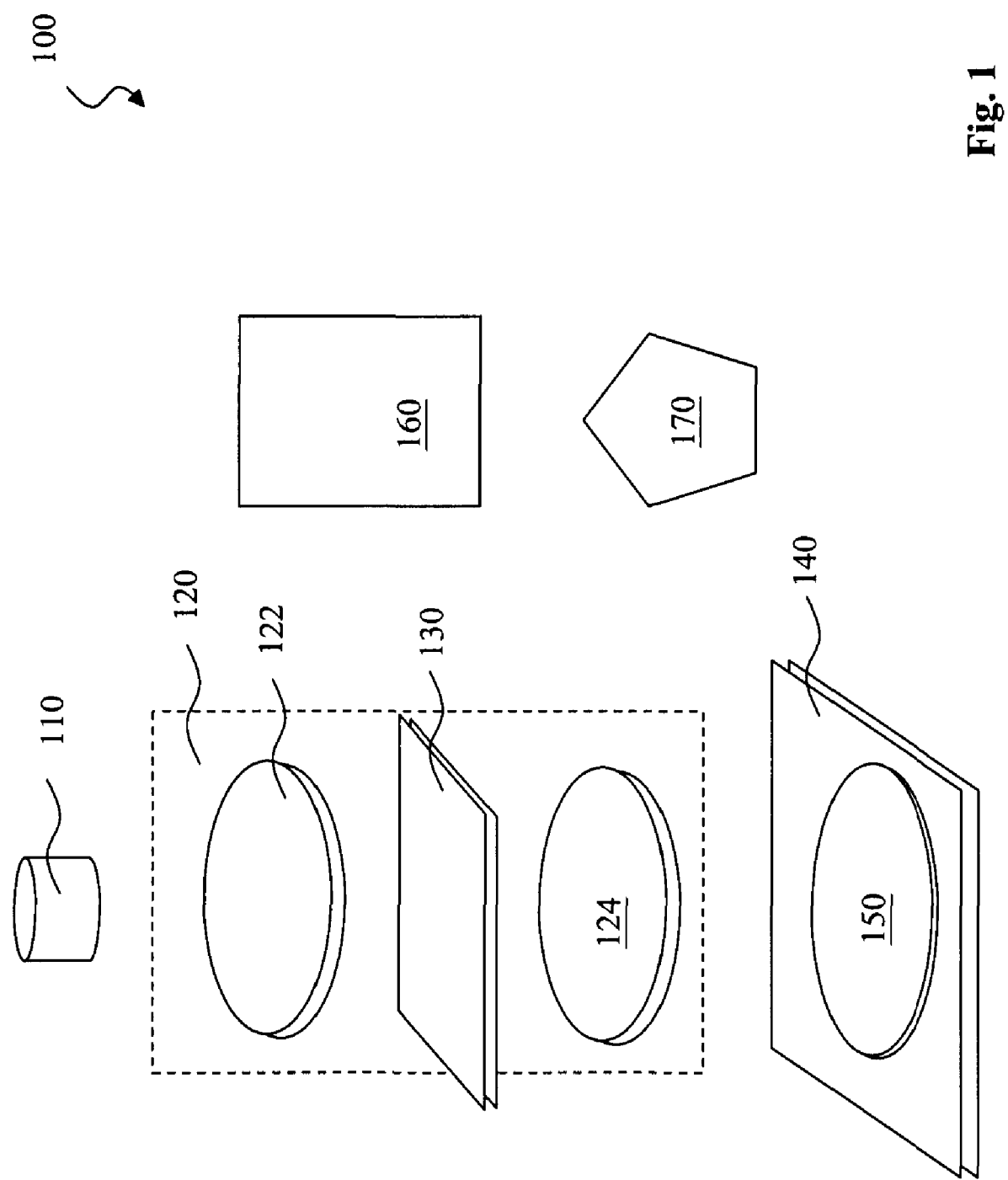
FIG. 1 is a schematic view of one embodiment of a lithography apparatus constructed according to aspects of the present disclosure.

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
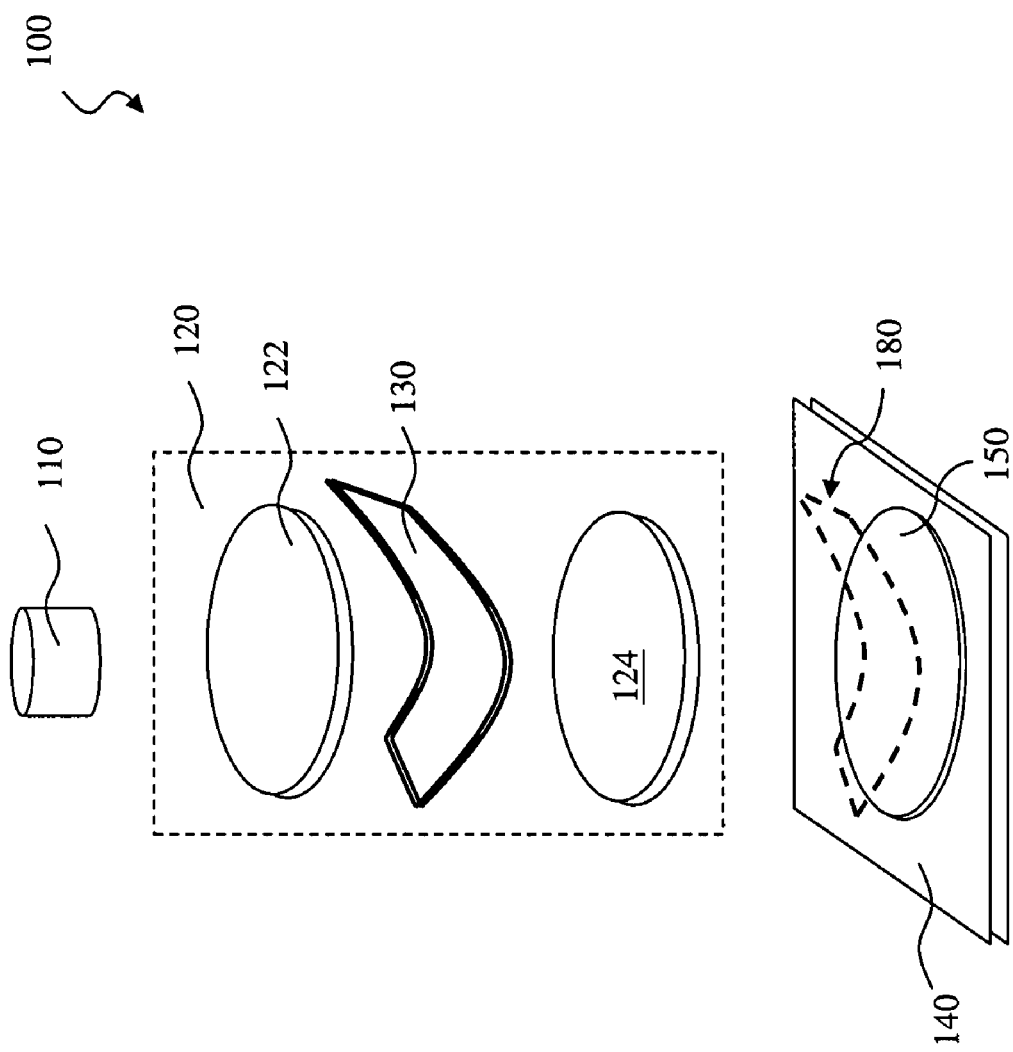
FIG. 2 is a schematic view of a lithography apparatus, such as the apparatus of FIG. 1, with a mask having an non-flat profile configured according to aspects of the present disclosure.

Referring to FIGS. 1 and 2, a lithography apparatus 100 is one example of a system that can benefit from various embodiments or aspects of the present invention. For the sake of further example, the lithography apparatus 100 has an integrated mask flatness metrology tool, as discussed in greater detail below. FIG. 3 is a flowchart of one embodiment of a method 300 to form an integrated circuit. With reference to FIGS. 1 through 3, the method 300 and the lithography apparatus 100 are collectively described below. It is understood that additional steps can be provided before, during, and after the method 300, and some of the steps described below can be replaced or eliminated, for additional embodiments of the method The method 300 begins at step 302 by providing a lithography apparatus 100 and a mask used for lithography patterning. The lithography apparatus 100 includes a radiation source 110 to provide radiation beams (radiation energy). The radiation source 110 may be a suitable light source such as an ultra-violet (UV), deep ultra-violet (DUV), or extreme ultra-violet (EUV) source. For example, the radiation source 110 may be, but not limited to, a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a wavelength below approximately 100 nm.

The lithography apparatus 100 includes a lens system 120 to project radiation energy for lithography patterning. The lens system 120 further includes an illumination module (e.g., a condenser) 122 having a single lens, or multiple lenses and other lens components. In one or more embodiments, the illumination module 122 may include microlens arrays, shadow masks, or other structures designed to aid in directing radiation beams from the radiation source 110 onto a photomask (also referred to as a "mask" or "reticle").

The lens system 120 also includes an imaging lens module 124. The imaging lens module 124 may have a single lens or a plurality of lens elements configured to project the radiation beam onto a substrate.

In the present embodiment, a mask 130 is used in the lithography apparatus 100 during a lithography process. The mask 130 may include a transparent substrate and an absorption layer. The transparent substrate may use fused silica ($SiO_2$), borosilicate glass, or soda-lime glass. The absorption layer may be formed using a plurality of processes and materials, such as depositing a metal film made with chromium (Cr), iron oxide, or an inorganic film made with MoSi, ZrSiO, SiN, and/or TiN. The absorption layer may be patterned to have one or more openings where radiation beams may travel through without being absorbed and have one or more absorption areas where the radiation beams may be completely or partially blocked thereby. In one example, the mask may include a binary intensity mask (BIM or binary mask) including chrome areas and transparent quartz areas. The mask may alternatively or additionally include various optical proximity correction (OPC) features. In another example, the mask 130 may be an alternating phase shift mask (AltPSM), employing alternating areas of chrome and 180 degree-shifted quartz. In another example, the mask 130 may be an attenuating phase shift mask (AttPSM), employing an attenuating material such as MoSi with 80 degree phase shift and transparent quartz. Alternatively, the mask may include chromeless phase lithography (CPL) features. The mask 130 is operable to move in translational and rotational modes. The mask 130 may have a non-flat profile, as illustrated in FIG. 2, induced by various factors such as material inhomogeneity and stresses including thermal stress.

The lithography apparatus 100 may further include a mask stage (not shown) having a scan function. The mask stage is operable to secure the mask and manipulate the mask in transitional and/or rotational modes.

The lithography apparatus 100 includes a substrate stage 140 for holding and manipulating a substrate 150 to be patterned in transitional and/or rotational modes during a lithography patterning process. It is understood that the manipulation of the substrate 150 is considered relative to the mask 130, so that one or both of the mask 130 and stage 140 can move to achieve the desired manipulation. The substrate stage 140 may be designed to implement a step-and-scan process or other proper exposure processes.

In the present embodiment, the substrate 150 is a semiconductor wafer having silicon, germanium, diamond, or a compound semiconductor. The substrate 150 may alternatively include other materials such as glass for thin-film transistor liquid crystal display (TFT-LCD) devices or fused silicon/calcium fluoride for photomasks. The substrate 150 may include a plurality of layers formed thereon, each having patterned structures. The substrate 150 may include a material layer formed thereon and to be patterned. The substrate 150 is further coated with an imaging layer for lithography patterning process such as photoresist. An exemplary photoresist include chemical amplification resist (CAR).

The lithography apparatus 100 may include other functional modules such as an alignment device and/or a focus servo device capable of detecting alignment, and focusing a non-developed image layer, respectively.

A mask flatness metrology tool 160 may be further integrated with the lithography apparatus 100. The mask flatness metrology tool is operable to measure flatness of a mask such as the mask 130, utilizing proper technologies such as liquid crystal display imaging or optical reflection. In one embodiment, the mask flatness metrology tool 160 is coupled to the lithography apparatus 100 such that mask flatness data measured thereby can be distributed to the lithography apparatus 100 for further calculation and focal plane adjustment. In another embodiment, the mask flatness metrology tool 160 is embedded in the lithography apparatus 100 such that the mask flatness measurement can be implemented in and controlled by the lithography apparatus.

As one embodiment, the lithography apparatus 100 further includes a control module 170 having proper hardware, software and interface configured to distribute measured mask flatness data; calculate focal deviation of the mask based on the mask flatness of the mask; and/or adjust the lens system to compensate the focal deviation. The control module 170 includes a mathematical model to relate the mask flatness to the focal deviation. The control module may include proper interface to communicate with the lens system 120 and the mask flatness metrology tool 160. The control module 170 may be built in the lithography apparatus 100. Alternatively, the control module 170 may be distributed in the lithography apparatus 100 and/or other manufacturing units such as manufacturing execution system (MES). The control module 170 may further include a database to save, sort, and analyze the measured mask flatness data.

The method 300 proceeds to step 304 by measuring mask flatness of the mask 130 using the integrated mask flatness metrology tool 160 of FIG. 1 or a standalone mask flatness metrology tool. The mask is globally measured for the mask patterned surface profile (also referred to as mask flatness) in various regions including the main circuit pattern region. In an embodiment of using the integrated mask flatness metrology tool 160, the mask 130 is positioned and secured on the mask stage of the lithography apparatus 100 or a separate mask stage and is measured for the mask flatness. In another embodiment of using a standalone mask flatness metrology tool, the mask is measured therein and then positioned in the lithography apparatus 100 for exposure processing. The measured mask flatness data are distributed to the lithography apparatus 100 or other proper database for further analysis and other uses.

The method 300 proceeds to step 306 by calculating a focal plane error (also referred to as a focal deviation) as the pattern of the mask 130 is imaged to the substrate 150. Referring specifically to FIG. 2, when the mask 130 is imaged to the substrate 150, the non-flat pattern of the mask 130 will also cause the focal plane 180 of the mask image to be deformed, resulting in the focal deviation. Therefore, the focal deviation is quantitatively related with the mask flatness. In one embodiment, a linear equation defined as $f=a*m+b$ is used to describe the relationship between the focal deviation and the mask flatness, in which f stands for the focal deviation, m stands for the mask flatness, and a and b are constant parameters. The constant parameters a and b may be determined based on previous measured mask flatness data and focal deviation data. As one example of a 4× mask, a is about 0.05 and b is about 2. In various situations, the parameters a and b may take different values. An adaptive model may be used for dynamically tuning the parameters a and b according to accumulated mask flatness and focal deviation data to catch system drift and variation. Such adaptive model may be included in the control module 170 for automatic tuning and calculation. By utilizing the linear equation $f=a*m+b$ or adaptive model, the focal deviation of the mask 130 can be calculated based on the associated mask flatness data of the mask 130 measured at the previous step.

The method 300 proceeds to step 308 by adjusting the lithography apparatus 100 such that the focal deviation is compensated to achieve a substantially flat focal plane with reduced imaging deformation and improved imaging resolution. The adjustment of the lithography apparatus 100 at this step may include adjusting the lens system 120 and/or the substrate stage 140 to compensate the focal deviation. In one embodiment, the lithography apparatus (such as stepper) exposes a substrate in a step-and-repeat mode. The substrate moves along the optical axis of the lithography apparatus when stepped to a field to be exposed, to adjust the focal distance for that field according to an average focal deviation on that field. In another embodiment, the lithography apparatus (such as scanner) exposes a substrate in a step-and-scan mode. the substrate moves dynamically along the optical axis according to the focal deviation to compensate thereof during a scanning process. The adjustment of the lithography apparatus 100 may be implemented automatically such as by the control module 170. The adjustment of the lithography apparatus 100 may be implemented each time when the mask 130 is used to expose a substrate for lithography patterning.

In current practice, mask flatness is obtained by measuring reticle shape correction (RSC) marks disposed around the periphery of the mask. The mask flatness data within the main pattern region is not directly measured. Instead, it is simulated based on the mask flatness data on these regions around the main pattern region. Thus obtained flatness data is inaccurate. The proper focus adjustment is limited accordingly. The disclosed method and the system enable direct measurement of the mask flatness within the main pattern region of a mask, more accurate focal deviation prediction, compensated focal deviation, and enhanced imaging resolution. The measurement of mask flatness and adjustment of the focal plane may be implemented automatically and/or in situ.

The method 300 proceeds to step 310 by exposing a substrate utilizing the mask 130 and the lithography apparatus 100 adjusted at the previous step. After the lithography apparatus 100 is adjusted according to the focal deviation of the mask 130, the substrate 150 is exposed with the compensated focal deviation and improved resolution. For an example of the mask flatness being measured while the mask 130 is positioned in the lithography apparatus 100, the exposing process may be implemented without reloading the mask to the mask stage such that most environmental induced non-flatness is properly considered and compensated after the adjustment. The exposing process will form an image of the mask pattern on the imaging layer of the substrate 150. During the exposing process, a radiation energy such as ultraviolet (UV) or extra ultraviolet (EUV) may be employed and directed through the lens system and the mask having a predefined pattern. The radiation energy is then further directed to the imaging layer coated on the substrate. In one embodiment, as an immersion lithography technique is used, the radiation energy is also directed through the immersion fluid (such as water) dispensed between the substrate and the imaging lens 124.

Other processing steps may follow for the lithography patterning. For example, the exposed imaging layer of the substrate 150 is further baked (also referred to as an post exposure baking or PEB) after the exposing process. The PEB may be implemented at a predefined temperature range and duration. The imaging layer of the substrate 150 may be further developed in a developing solution. The exposed regions of the imaging layer are dissolved in the developing solution if the imaging layer is a positive-type, or the unexposed regions are dissolved if the imaging layer is a negative-type. Other processing steps may alternatively or additionally be incorporated into the method 300 according to the resist material and the lithography system in a particular application.

The lithography apparatus and the method utilizing thereof may have other variations, modifications, and extensions without departing from the spirit and scope of the invention. For example, a track unit including baking and developing functions may be additionally integrated with the lithography apparatus. The lithography apparatus may be designed to perform exposure in a scan and step mode, or other modes. In another embodiment, the embedded mask flatness metrology tool will distribute its measured mask flatness data to the control module of the lithography apparatus or a remote database. The exposure recipe may be tuned, coordinated, and/or associated with the mask flatness in compensating the focal deviation. The method 300 may be performed in an immersion lithography apparatus.

Thus, the present disclosure provides a method for lithography patterning. The method includes providing a mask for photolithography patterning; measuring a mask flatness of the mask; calculating focal deviation of imaging the mask to a substrate in a lithography apparatus; adjusting the lithography apparatus to have a compensated focal plane of the mask based on the focal deviation; and exposing the semiconductor substrate utilizing the mask and the lithography apparatus with adjusted focal plane.

In the disclosed method, the calculating of the focal deviation may include utilizing a linear fit. The linear fit may include a linear regression equation of $f=a*m+b$ in which f stands for the focal deviation, m stands for the mask flatness, and a and b are constant parameters. In one example, a is about 0.05 and b is about 2 for a 4× mask. The measuring of the mask flatness may include using a mask flatness metrology tool. In various embodiments, the measuring of the mask flatness may be implemented in the mask flatness metrology tool integrated with the lithography apparatus. The measuring of the mask flatness may be implemented while the mask is secured on a mask table in the lithography apparatus before the exposing of the semiconductor substrate, by the mask flatness metrology tool integrated with the lithography apparatus. The measuring of the mask flatness may include measuring a circuit pattern region of the mask. The adjusting of the focal plane may be implemented automatically by the lithography apparatus based on the focal deviation.

The present disclosure also provides a lithography apparatus. The lithography apparatus includes a lens system; a substrate stage configured to secure a substrate for receiving a radiation energy through the lens system, and designed operable to support relative movement between the substrate and the lens system; a mask flatness metrology tool integrated in the lithography apparatus and configured to measure mask flatness of a mask having a pattern to be transferred to the substrate; and a control module. The control module is configured to be capable of calculating a focal deviation of the mask based on the mask flatness of the mask and adjust the lens system to compensate the focal deviation accordingly.

In the disclosed lithography apparatus, the lens system may include a projection lens module configured for forming an image of a circuit pattern of the mask to the substrate. The lithography apparatus may further include a radiation source configured to image the mask to the substrate during an exposing process. In one example, the control module is capable of acquiring measured mask flatness data from the mask flatness metrology tool. The control module may include a adaptive model to calculate the focal deviation of the mask.

The present disclosure also provides another embodiment of a method for lithography patterning. The method includes measuring a mask flatness of a mask using a mask flatness metrology tool; calculating focal deviation of imaging the mask to a substrate in a lithography apparatus; and adjusting the lithography apparatus to have a compensated focal plane of the mask based on the focal deviation.

The method may further include exposing the substrate utilizing the mask and the lithography apparatus with the compensated focal plane of the mask. The measuring of the mask flatness may include utilizing the mask flatness metrology tool integrated with the lithography apparatus. The calculating of the focal deviation may include utilizing a linear regression equation of $f=a*m+b$ in which f stands for the focal deviation, m stands for the mask flatness, and a and b are constant parameters. The calculating of the focal deviation may include utilizing a adaptive model dynamically tuned according to various mask flatness data. The measuring of the mask flatness may include measuring a circuit pattern region of the mask.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method for lithography patterning, comprising:
providing a mask for photolithography patterning;
measuring a mask flatness of the mask using one of liquid crystal display imaging and optical reflection;
calculating a focal deviation of imaging the mask to a substrate in a lithography apparatus, wherein the focal deviation is calculated using measured mask flatness data from a main pattern region of the mask, and wherein the calculating of the focal deviation comprises utilizing a linear fit, wherein the linear fit comprises a regression equation of f=a*m+b in which f stands for the focal deviation, m stands for the mask flatness, and a and b are constant parameters;

adjusting the lithography apparatus to have a compensated focal plane of the mask based on the focal deviation; and exposing the semiconductor substrate utilizing the mask and the lithography apparatus with the adjusted focal plane.

2. The method of claim 1, wherein a is about 0.05 and b is about 2 for a 4× mask.

3. The method of claim 1, wherein the measuring of the mask flatness comprises using a mask flatness metrology tool.

4. The method of claim 3, wherein the measuring of the mask flatness is implemented in the mask flatness metrology tool integrated with the lithography apparatus.

5. The method of claim 3, wherein the measuring of the mask flatness is implemented while the mask is secured on a mask table in the lithography apparatus before the exposing of the semiconductor substrate, by the mask flatness metrology tool integrated with the lithography apparatus.

6. The method of claim 1, wherein the measuring of the mask flatness comprises measuring a circuit pattern region of the mask.

7. The method of claim 1, wherein the adjusting of the focal plane is implemented automatically by the lithography apparatus based on the focal deviation.

8. A lithography apparatus, comprising:
a lens system;
a substrate stage configured to secure a substrate for receiving a radiation energy through the lens system, and designed operable to support relative movement between the substrate and the lens system;
a mask flatness metrology tool integrated in the lithography apparatus and configured to measure mask flatness of a mask having a pattern to be transferred to the substrate using one of liquid crystal display imaging and optical reflection; and
a control module configured to be capable of:
calculating a focal deviation of the mask based on the measured mask flatness in a main pattern region of the mask, wherein the calculating of the focal deviation comprises utilizing a linear fit, wherein the linear fit comprises a regression equation of f=a*m+b in which f stands for the focal deviation, m stands for the mask flatness, and a and b are constant parameters; and
adjust the lens system to compensate the focal deviation accordingly.

9. The apparatus of claim 8, wherein the lens system comprises a projection lens module configured for forming an image of a circuit pattern of the mask to the substrate.

10. The apparatus of claim 8, further comprising a radiation source configured to image the mask to the substrate during an exposing process.

11. The apparatus of claim 8, wherein the control module is capable of acquiring measured mask flatness data from the mask flatness metrology tool.

12. The apparatus of claim 11, wherein the control module comprises an adaptive model to calculate the focal deviation of the mask.

13. A method for lithography patterning, comprising:
measuring a mask flatness of a mask using a mask flatness metrology tool using one of liquid crystal display imaging and optical reflection;
calculating focal deviation of imaging the mask to a substrate in a lithography apparatus, wherein the focal deviation is calculated using measured mask flatness data from a main pattern region of the mask, and wherein the calculating of the focal deviation comprises utilizing a linear fit, wherein the linear fit comprises a regression equation of f=a*m+b in which f stands for the focal deviation, m stands for the mask flatness, and a and b are constant parameters; and
adjusting the lithography apparatus to have a compensated focal plane of the mask based on the focal deviation.

14. The method of claim 13, further comprising exposing the substrate utilizing the mask and the lithography apparatus with the compensated focal plane of the mask.

15. The method of claim 13, wherein the measuring of the mask flatness comprises utilizing the mask flatness metrology tool integrated with the lithography apparatus.

16. The method of claim 13, wherein the calculating of the focal deviation comprises utilizing an adaptive model dynamically tuned according to various mask flatness data.

17. The method of claim 13, wherein the measuring of the mask flatness comprises measuring a circuit pattern region of the mask.

* * * * *